(12) United States Patent
Verdesio

(10) Patent No.: US 10,879,895 B2
(45) Date of Patent: Dec. 29, 2020

(54) SENSOR DEVICE FOR DETECTING THE PRESENCE OF AN ELECTRICALLY CONDUCTIVE SUBSTANCE IN A SPACE REGION, AND APPLICATIONS THEREOF

(71) Applicant: BITRON S.p.A., Turin (IT)

(72) Inventor: Paolo Verdesio, Moncalieri (IT)

(73) Assignee: BITRON S.p.A., Turin (IT)

( * ) Notice: Subject to any disclaimer, the term of this patent is extended or adjusted under 35 U.S.C. 154(b) by 64 days.

(21) Appl. No.: 16/094,512

(22) PCT Filed: Apr. 19, 2017

(86) PCT No.: PCT/IB2017/052220
§ 371 (c)(1),
(2) Date: Oct. 18, 2018

(87) PCT Pub. No.: WO2017/182953
PCT Pub. Date: Oct. 26, 2017

(65) Prior Publication Data
US 2019/0356311 A1 Nov. 21, 2019

(30) Foreign Application Priority Data
Apr. 19, 2016 (IT) .................. 102016000039976

(51) Int. Cl.
*H03K 17/94* (2006.01)
*A47L 15/00* (2006.01)
(Continued)

(52) U.S. Cl.
CPC .......... *H03K 17/94* (2013.01); *A47L 15/0018* (2013.01); *A47L 15/4409* (2013.01);
(Continued)

(58) Field of Classification Search
CPC ............. A47L 15/0018; A47L 15/4409; A47L 2401/24; H03K 17/94; D06F 39/002;
(Continued)

(56) References Cited

U.S. PATENT DOCUMENTS

| 5,311,769 A | 5/1994 | Hetzel | |
| 2003/0024280 A1* | 2/2003 | Peterson | .................. D06F 33/02 |
| | | | 68/12.01 |

(Continued)

FOREIGN PATENT DOCUMENTS

| KR | 10-0727674 B1 | 6/2007 |
| WO | 94/03817 A1 | 2/1994 |

(Continued)

OTHER PUBLICATIONS

Written Opinion of the International Searching Authority of PCT/IB2017/052220 dated Oct. 13, 2017.

(Continued)

*Primary Examiner* — Rexford N Barnie
*Assistant Examiner* — Jagdeep S Dhillon
(74) *Attorney, Agent, or Firm* — Sughrue Mion, PLLC

(57) ABSTRACT

A sensor device for detecting the presence of an electrically conductive substance in a space region, and applications thereof. The sensor device includes a detecting circuit, including at least first and second foils or sheets of an electrically conductive material; and a control circuit coupled with said detecting circuit and having an output connected with one of the foils for applying a first electric radiofrequency signal thereto and an input connected to other one of the foils for receiving a second radiofrequency signal induced in said other foil. The control circuit generates an information signal indicative of the strength of the second signal, which varies as a function of the presence of a body or a substance on or at said other foil.

6 Claims, 3 Drawing Sheets

(51) Int. Cl.
  *A47L 15/44* (2006.01)
  *D06F 34/18* (2020.01)
  *D06F 34/22* (2020.01)
  *G01N 27/12* (2006.01)

(52) U.S. Cl.
  CPC .............. *D06F 34/18* (2020.02); *D06F 34/22* (2020.02); *A47L 2401/24* (2013.01); *G01N 27/121* (2013.01)

(58) Field of Classification Search
  CPC ....... D06F 75/14; D06F 75/24; G05B 19/042; G05B 2219/2633
  USPC .......................... 307/116, 118, 11, 66, 64, 80
  See application file for complete search history.

(56) References Cited

U.S. PATENT DOCUMENTS

| | | | | |
|---|---|---|---|---|
| 2003/0024281 A1* | 2/2003 | Peterson | ................ | D06F 33/02 68/12.27 |
| 2003/0024796 A1* | 2/2003 | Peterson | ................ | D06F 33/02 200/11 R |
| 2003/0025395 A1* | 2/2003 | Peterson | ................ | D06F 33/02 307/11 |
| 2003/0028258 A1* | 2/2003 | Peterson | ................ | D06F 33/02 700/11 |
| 2003/0028261 A1* | 2/2003 | Peterson | ................ | D06F 33/02 700/19 |
| 2003/0028270 A1* | 2/2003 | Peterson | ................ | D06F 33/02 700/83 |
| 2003/0028271 A1* | 2/2003 | Peterson | ................ | D06F 33/02 700/85 |
| 2006/0192679 A1 | 8/2006 | Buckley et al. | | |
| 2010/0271152 A1* | 10/2010 | Sabah | ................... | G01L 19/083 333/193 |
| 2010/0331050 A1* | 12/2010 | Tahk | ..................... | H01Q 1/243 455/566 |
| 2011/0259098 A1 | 10/2011 | Park | | |
| 2013/0201316 A1* | 8/2013 | Binder | ................... | H04L 67/12 348/77 |
| 2014/0060121 A1* | 3/2014 | Burger | ................... | D06F 39/02 68/17 R |
| 2014/0209120 A1 | 7/2014 | Allen et al. | | |
| 2015/0068069 A1* | 3/2015 | Tran | ...................... | H04B 1/385 36/136 |

FOREIGN PATENT DOCUMENTS

| | | |
|---|---|---|
| WO | 99/10713 A1 | 3/1999 |
| WO | 2010/038189 A1 | 4/2010 |

OTHER PUBLICATIONS

International Search Report of PCT/IB2017/052220 dated Oct. 13, 2017.

\* cited by examiner

SENSOR DEVICE FOR DETECTING THE PRESENCE OF AN ELECTRICALLY CONDUCTIVE SUBSTANCE IN A SPACE REGION, AND APPLICATIONS THEREOF

CROSS REFERENCE TO RELATED APPLICATIONS

This application is a National Stage of International Application No. PCT/IB32017/052220 filed Apr. 19, 2017, claiming priority based on Italian Patent Application No. 102016000039976 filed Apr. 19, 2016.

BACKGROUND OF THE INVENTION

Field of the Invention

The present invention relates to a sensor device for detecting the presence of a body or substance, in particular one that is electrically conductive, in a predetermined spatial region.

Background

An object of the present invention is to provide an improved sensor device, which may appropriately be used in a plurality of possible technical applications.

A further object of the present invention is to make such sensor device simple and cost-effective to manufacture with a very reliable operation.

SUMMARY OF THE INVENTION

These and other objects are achieved according to the present invention with a sensor device comprising
- detecting circuit means, including first and second foils or sheets of an electrically conductive material; and
- control circuit means coupled to said detecting circuit means and having an output connected to the first foil to apply, in the operation of such first foil, a first electric radiofrequency signal and an input connected to the other or second foil to receive a second induced radiofrequency signal on said second foil;
- said control circuit means being arranged to generate an information signal indicative of the strength of said second signal, which may vary as a function of the presence of a body or a substance, in particular one that is electrically conductive, on or near said second foil.

Preferably, though not necessarily, said first and second foils are applied on two opposite sides of a circuit support board, preferably in a partially juxtaposed relationship.

Such sensor device may appropriately be used in a plurality of applications.

By way of a purely illustrative and non-limiting example, such sensor device may be used as a wetness sensor for induction or radiant-type cook surfaces, as a water flow and/or wash basin sensor in washing machines (clothes washing machines and dishwashers), as a fluid level sensor in a container, as a beverage level sensor in beverage preparation machines, etc.

Another suitable application is, for example, for making tactile-type control devices.

BRIEF DESCRIPTION OF THE DRAWINGS

Further features, applications and advantages of the present invention will become apparent from the detailed description that follows, provided purely by way of non-limiting example with reference to the accompanying drawings, in which.

DETAILED DESCRIPTION OF THE INVENTION

Figure 1:
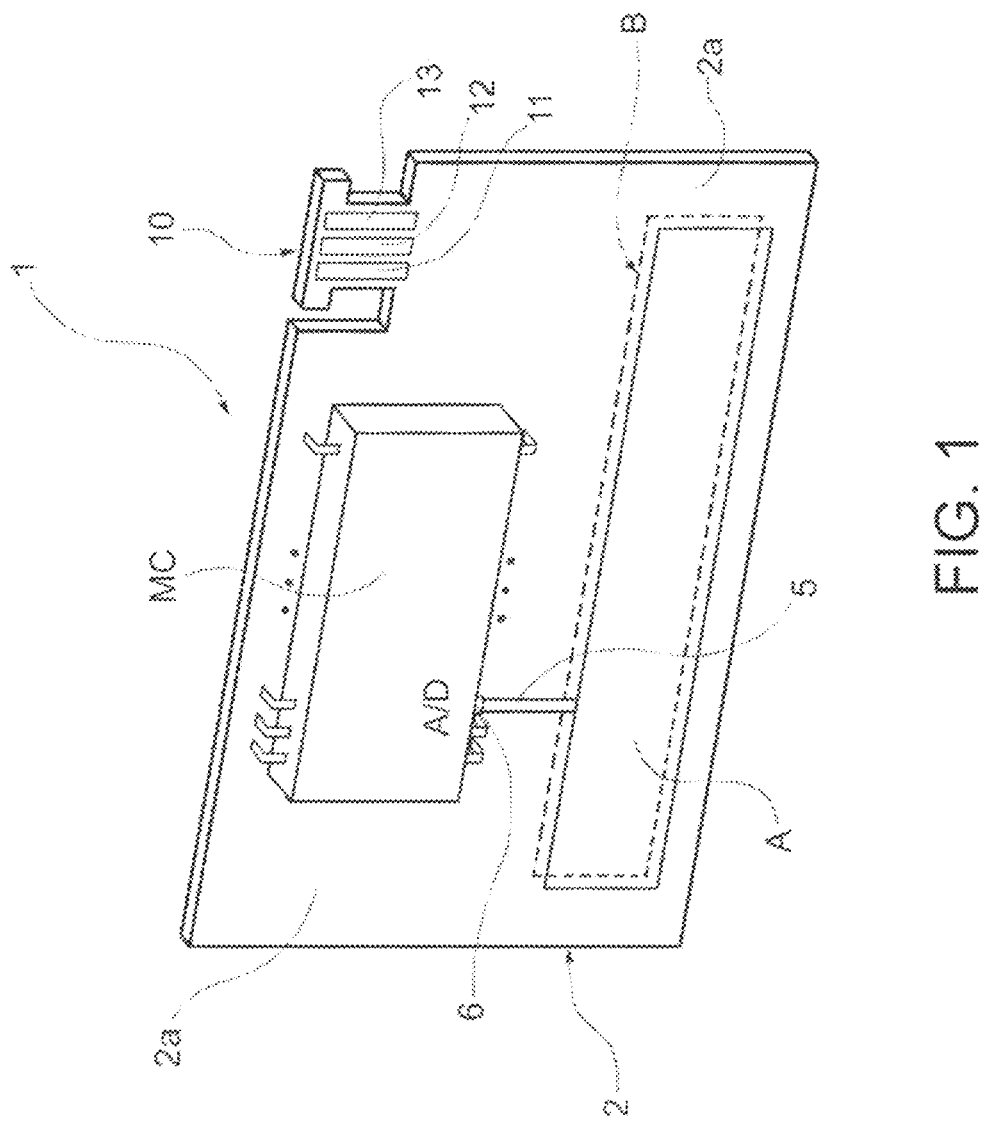
FIG. 1 is a perspective view showing a way of making a sensor device according to the present invention.

In the drawings, a sensor device according to the present invention for detecting the presence of an electrically conductive substance in a spatial region is indicated collectively at 1.

The sensor device 1 comprises an electrically insulating support board 2, such as a printed circuit board, which has, on a first main face 2a, a first foil A made of an electrically conductive material. The foil A is, for example, an electrolytic copper layer deposited on the support board 2, e.g. using the technique for making printed circuit boards or an otherwise known manner.

In the embodiment shown in a simplified way, on the opposite side or surface 2b of the board 2, there is provided a second foil B of electrically conductive material, e.g. copper.

In principle, the arrangement of the electrically conductive foils A and B on opposite sides of the support card 2 is not mandatory: in alternative embodiments, not shown in the drawings, such foils could be applied or otherwise deposited on the same side of the support board.

Preferably, although not necessarily, the foils A and B, if arranged on opposite sides of the same support board 2, as in the accompanying drawings, appropriately have at least one respective part in substantial juxtaposition with respect to a corresponding part of the other foil. This condition, however, is not mandatory.

With reference to FIG. 1, in the embodiment illustrated, on the main side or face 2a of the board 2, a microcontroller MC of a type known per se is provided, for example a microcontroller PIC16F18855 produced by the Microchip company.

Figure 2:
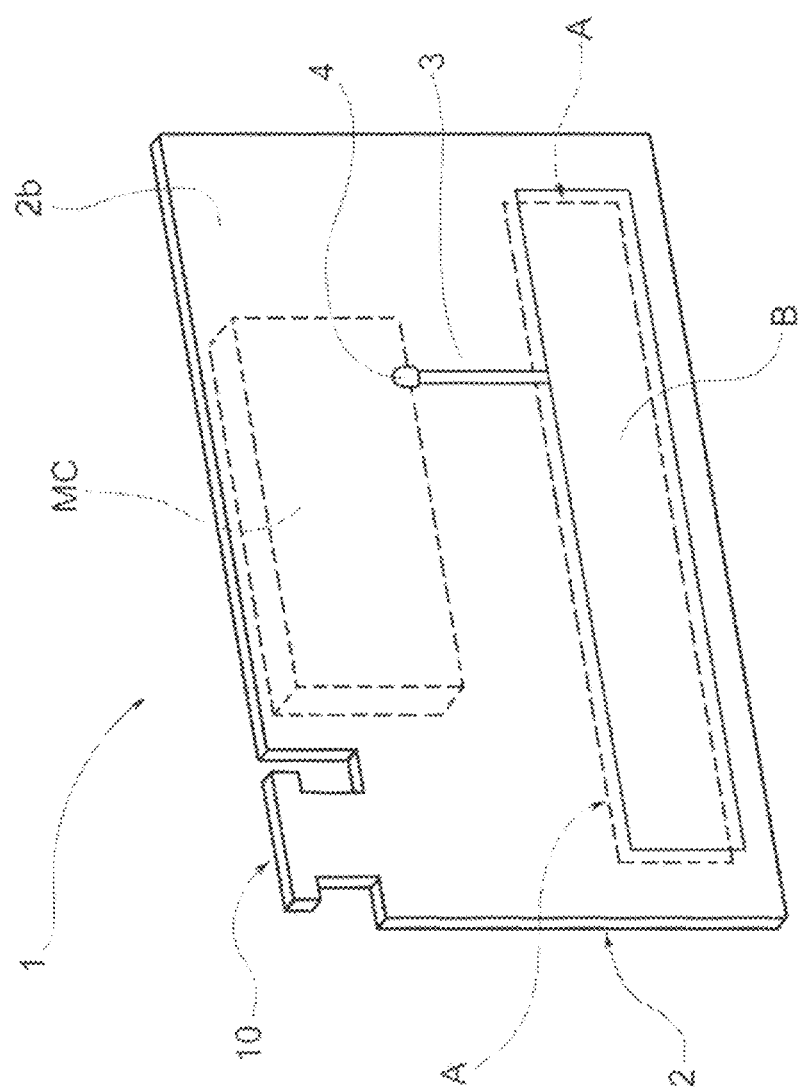
FIG. 2 is a perspective view of the sensor device according to FIG. 1, viewed from the opposite side.

As shown in FIG. 2, the foil B applied on the side or face 2b of the board 2 is connected to an output of the microcontroller MC through a conductive trace 3 and a metallic via-hole 4 that passes through the thickness of the board.

The microcontroller MC is arranged to apply to the foil B an electric radiofrequency signal, having a frequency in particular between 500 kHz and 10 MHz, for example around 4 MHz.

As can be seen in FIG. 1, the foil A is connected through a conductive trace 5 to an input 6 of the microcontroller MC.

In use, the foil B applied to the side or face 2b of the support board 2 radiates radiofrequency waves as a result of the signal applied to it by the microcontroller MC. Such waves induce on the foil A, applied on the side or face 2a of the board 2, a signal, equal to radiofrequency, applied to the input 6 of the microcontroller MC, which converts the received signal into digital form.

The microcontroller MC is also arranged to process the digital signal thus obtained and to generate an indicative information signal indicating the strength of such signal, which may vary as a function of the presence of an electrically conductive substance on the foil A. The electrically conductive substance may be in the liquid state (e.g. water or other conductive liquids) or solid state (coins, metal disks, etc.), or it may be represented by a user's finger.

As best seen in FIG. 1, a portion of the board 2, indicated at 10, forms a multipolar electrical connector with at least three terminals 11, 12 and 13, respectively for the positive and negative poles of a continuous supply voltage and for the emission of the information signal generated in the operation of the microcontroller MC.

As already mentioned in the introductory part of the present description, the device according to the present invention may be used for countless appropriate applications.

Figure 3:
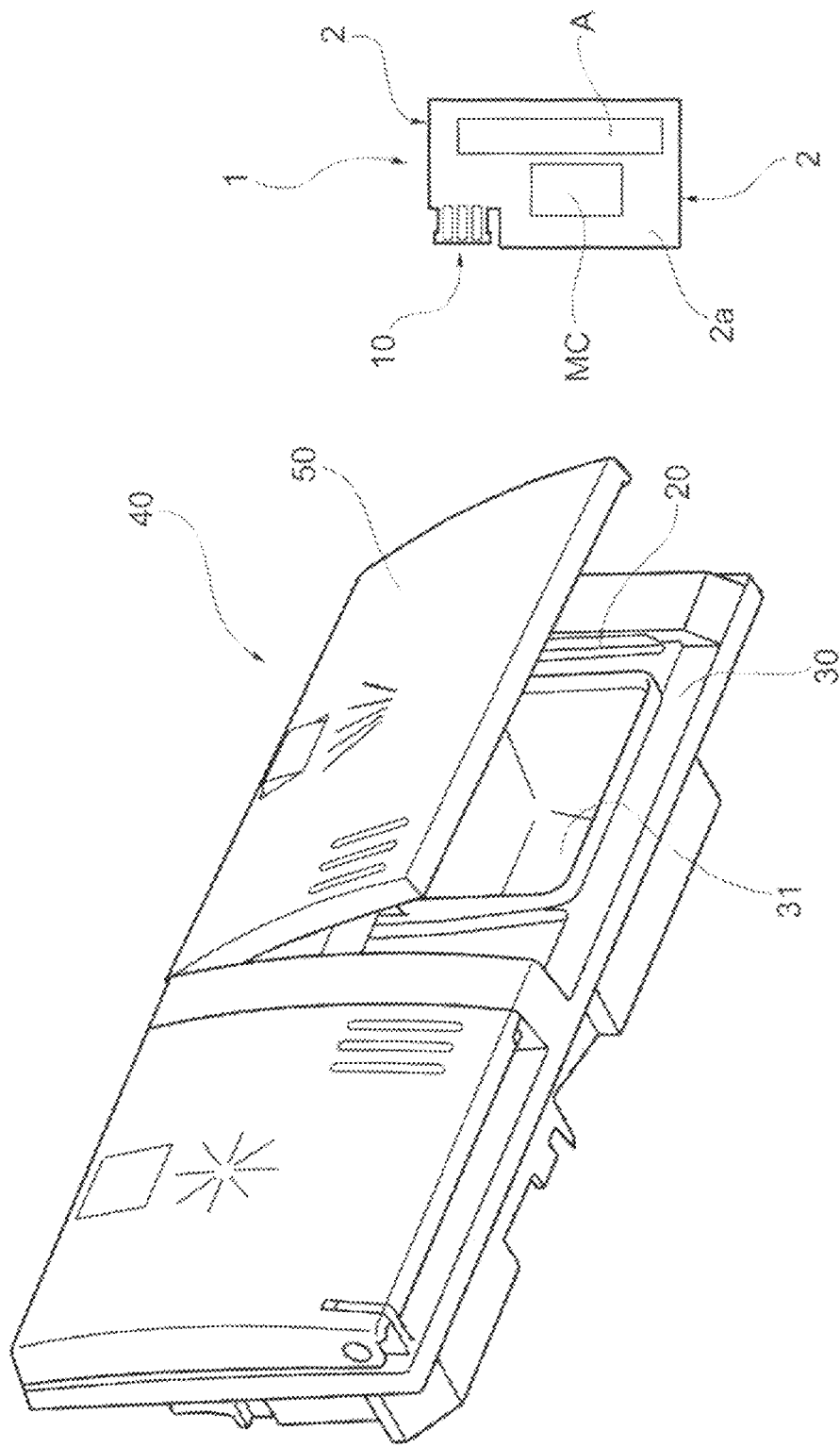
FIG. 3 is a perspective view of a washing agent dispensing device for dishwashers incorporating the sensor device according to the present invention.

Merely by way of illustrative and non-limiting example, FIG. 3 shows an application wherein a sensor 1 of the type described above with reference to FIGS. 1 and 2 is inserted into a slot 20, arranged in the body 30 of a detergent dispenser device 40 (and possibly other washing agents), for dishwasher machines.

The dispensing device 40, illustrated in FIG. 3, is of a known type and comprises a movable cover 50, which may be made to pass, in a manner known per se, from a closed position (not shown) to the open condition shown in FIG. 3, wherein a quantity or amount of detergent contained in a basin 31 may be poured into the washing chamber.

In the embodiment illustrated in FIG. 3, the slot 20 is made at the edge of the inlet opening of the basin 31.

The arrangement is such that after the dispensing of the detergent, or when the cover 50 has assumed the open condition illustrated in the drawing, a wash jet sprayed by a spraying impeller of the machine may periodically hit the dispensing device 40 and some of such jet may penetrate the slot 20 and splash the foil A of the sensor device 10 therein.

If the sprayer in question operates regularly, the sensor device 10 located in the slot 20 will periodically detect the arrival of a wash jet and will signal to the dishwasher control unit that said impeller is rotating regularly.

If for any reason said spraying impeller is blocked, the sensor device 10 will no longer detect the periodic arrival of washing splashes on its foil A and will provide a corresponding information signal to the machine control unit.

In the above described function with reference to FIG. 3, the sensor device 10 does not need to be placed inside or in any case on board the dispenser device 40. It may in fact be located in countless other locations in the machine's washing chamber where it may be cyclically hit by a wash jet sprayed by the spraying impeller the operation of which one intends to control.

Naturally, without altering the principle of the invention, the embodiments and the details of implementation may vary widely with respect to those described and illustrated purely by way of non-limiting example, without thereby departing from the scope of the invention as defined in the appended claims.

The invention claimed is:

1. A sensor device for detecting the presence of a body or substance in a spatial region, for detecting an electrically conductive liquid flow in a washing machine, comprising
   a detecting circuit, including a first foil or first sheet and a second foil or second sheet, said first and second foils or said first and second sheets being of an electrically conductive material; and
   a controller coupled with said detecting circuit and having an output connected with the second foil or second sheet for applying a first radiofrequency signal thereto and an input connected to the first foil or first sheet for receiving a second radiofrequency signal induced in said first foil or first sheet by radiofrequency waves radiated by the second foil or second sheet;
   said controller being arranged to generate an information signal indicative of the strength of said second radiofrequency signal, which varies as a function of the presence of the body or the substance on or near said first foil or first sheet.

2. A sensor device according to claim 1, wherein said detecting circuit comprise at least one circuit support board.

3. A sensor device according to claim 2, wherein said first and second foils or said first and second sheets are disposed on opposite faces of said circuit support board.

4. A sensor device according to claim 3, wherein said first and second foils or said first and second sheets are at least partially juxtaposed with each other.

5. A sensor device according to claim 1, wherein said controller comprise a microcontroller.

6. A sensor device according to claim 5, wherein said microcontroller is arranged to convert said second radiofrequency signal into a digital form.

* * * * *